United States Patent [19]

Henneuse

[11] 4,285,051
[45] Aug. 18, 1981

[54] LOW GLITCH CURRENT SWITCH
[75] Inventor: Paul R. Henneuse, San Jose, Calif.
[73] Assignee: Precision Monolithics, Inc., Santa Clara, Calif.
[21] Appl. No.: 125,912
[22] Filed: Feb. 29, 1980
[51] Int. Cl.³ ............................................. G11C 27/02
[52] U.S. Cl. ..................................... 365/45; 365/149; 320/1
[58] Field of Search ....................... 365/45, 149; 320/1
[56] References Cited

U.S. PATENT DOCUMENTS

| | | | |
|---|---|---|---|
| 3,161,858 | 12/1964 | Sanders et al. | 365/149 |
| 3,700,998 | 10/1972 | Lee et al. | 320/1 |

FOREIGN PATENT DOCUMENTS

| | | | |
|---|---|---|---|
| 1385410 | 2/1975 | United Kingdom | 365/45 |
| 570109 | 8/1977 | U.S.S.R. | 365/45 |

Primary Examiner—Stuart N. Hecker
Attorney, Agent, or Firm—Richard S. Koppel

[57] ABSTRACT

An improved analog track and hold circuit has a glitch-free output as the circuit switches between the tracking and the holding of an input analog signal. The circuit is of the type having a capacitor for storing an analog voltage, a transconductance amplifier for producing a charging current for the capacitor proportional to the analog voltage, a current switch for connecting and disconnecting the charging current for the capacitor, and an output circuit to buffer the capacitor voltage to the output. The improvement includes a diode array establishing first and second reference nodes across the capacitor. The diodes in the array clamp the first and second nodes to fixed incremental voltage values greater and lesser, respectively, than the capacitor voltage as the circuit tracks the analog voltage, and to fixed incremental voltage values lesser and greater, respectively, than the capacitor voltage, as the circuit holds the analog voltage. The nodes reverse their polarities by equal amounts during the switching of the circuit between the tracking and holding. In this manner, an equal and opposite voltage magnitude change is produced at each node during the switching interval, thereby preventing any net change in the capacitor voltage, and providing a glitch-free output. A special current switch gates currents through the diode array to effect the clamping.

20 Claims, 6 Drawing Figures

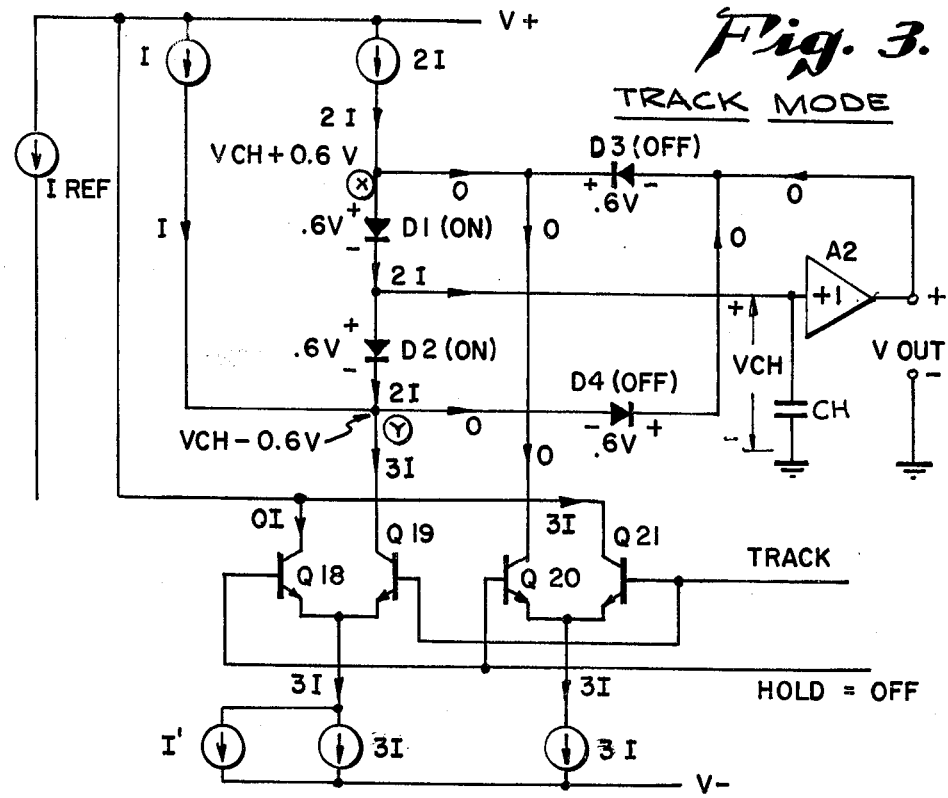
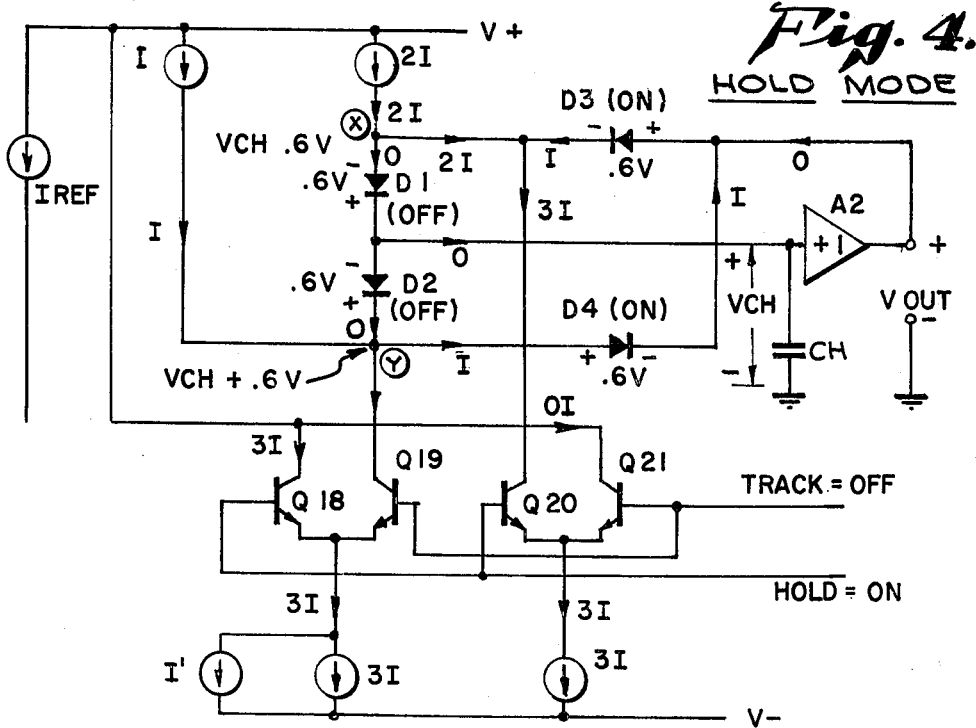

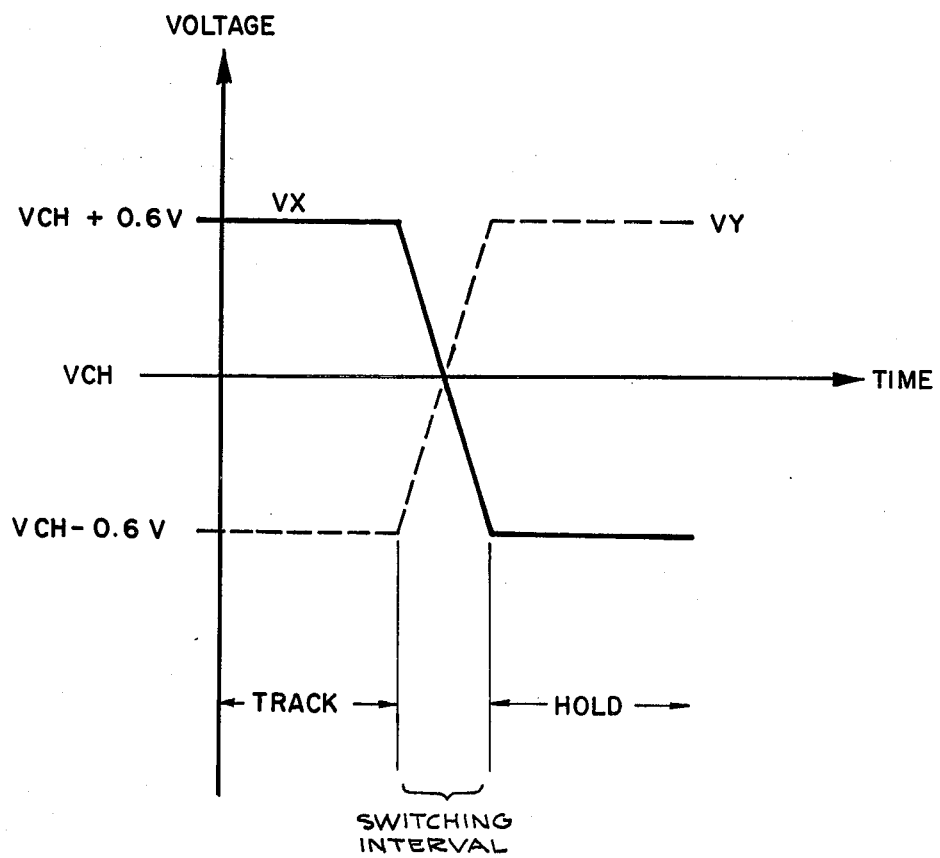

LOW GLITCH CURRENT SWITCH

FIELD OF THE INVENTION

The present invention, in general, relates to analog track and hold circuits, and, in particular, relates to improvements in such circuits to reduce unwanted output voltage changes as the circuits switch between the tracking and the holding of an input analog signal.

BACKGROUND OF THE INVENTION

Analog track and hold circuits are used in a wide range of applications such as data acquisition systems, memory systems, and oscillators. Such circuits are used to convert a changing analog voltage into a constant voltage over a predefined gating-time interval. The constant output of the circuit may then be converted, for example, to a digital signal by means of an analog-to-digital converter for various digital applications.

A track and hold circuit, or a sample and hold circuit, in its simplest form is a switch in series with a capacitor. During the time when an input voltage to the circuit is to be tracked, the switch is closed and the capacitor charges or discharges as necessary to follow the input. At the end of the tracking interval, when it is desired to hold the input voltage, the switch is opened. The capacitor is thereby prevented from charging or discharging and stores the last instantaneous value of the input voltage prior to the opening of the switch.

Modern analog track and hold circuits use very sophisticated switches, but still store the input signal as a voltage on a holding capacitor. The switch element is usually a bipolar or field effect transistor. The switch control signal is connected to the base or gate of the transistor. To track an input signal, the transistor is switched on and the voltage across the capacitor is free to follow the input voltage. To hold the voltage, the transistor is switched to the off or high-impedance state, thereby preventing the capacitor from charging or discharging.

A common problem with all analog track and hold circuits is that there are frequently unwanted voltage changes across the holding capacitor as the circuit changes between the track mode and the hold mode. These voltage changes are frequently quite fast and are referred to as "glitches." The voltage glitches result from the unwanted charging or discharging of the capacitor as the transistor switch opens and closes.

These narrow, short-duration glitches are extremely undesirable at the output of such circuits because they produce a change in the analog voltage stored on the capacitor. This problem is especially acute when the circuit is connected to a digital-to-analog converter. As the converter produces a digital equivalent of the voltage on the capacitor, the glitch will cause any digital computations subsequently performed on the digitized analog voltage to be in error.

The unwanted charging or discharging of the capacitor occurs because the transistors which do the switching are not perfect switch elements. That is, instead of making a transition from no resistance to infinite resistance, the transistor switches change from a few tens of ohms of resistance to hundreds of millions of ohms of resistance as the circuit changes between the tracking of the input analog signals to the holding of the signal. Furthermore, this resistance transition requires a finite time, as opposed to an ideal switch which switches in zero time. This imperfect action of the switch allows the capacitor to charge or discharge, thereby producing the glitches. Furthermore, as the transistor is turned off, stray capacitance can couple charge to the holding capacitor. Therefore, to the extent that the electronic switching element in a track and hold or sample and hold circuit can be made to operate more ideally and as unwanted charge coupling can be eliminated, the possibility of having voltage glitches across the holding capacitor is greatly reduced.

Accordingly, it is the principal object of the present invention to reduce the voltage glitches across the holding capacitor in analog track and hold or sample and hold circuits as these circuits change between the tracking or sampling of an input analog signal to the holding of the signal.

Another object of the present invention to provide a relatively inexpensive low-glitch current switch.

Still another object of this invention is to provide a low-glitch current switch in a manner which can be easily fabricated in integrated circuit form.

Other objects of the invention are to provide a low-glitch current switch which switches quickly, which accurately tracks an input analog voltage, and which incorporates good matching of the components to prevent or cancel unwanted charge coupling.

SUMMARY OF THE INVENTION

The present invention, in a broad aspect, provides an improved analog storage circuit of the type having a capacitor for storing an analog voltage connected to the circuit input, input circuitry for producing a charging current for the capacitor from the analog voltage, circuitry for connecting and disconnecting the charging current from the capacitor when the analog voltage is to be tracked and held, respectively, and output circuitry to buffer the voltage across the capacitor to the circuit output. The improvement prevents the voltage across the capacitor from changing as the circuit switches between tracking and holding of the input analog signal. As a result, the output of the circuit is free from glitches because the holding capacitor voltage is unchanged.

The improvement includes the provision of reference nodes on either side of the node through which charging current enters the capacitor. These reference nodes are respectively held at a first incremental voltage value above and below the voltage on the capacitor as the circuit tracks the input voltage, and are held at a second incremental voltage value of opposite polarity relative to the capacitor voltage as the circuit holds the input analog signal. The voltages are disposed so as to allow the capacitor to freely charge or discharge only during the tracking of the input signal. The improvement also includes a current switch connected to both of the reference nodes to direct current through the nodes in such a manner as to cause the voltage at the nodes to switch between the first and second incremental voltages as the circuit switches between tracking and holding. Such switching produces equal and opposite voltage magnitude changes at each reference node, thereby preventing any net change in the capacitor voltage during the switching interval. Since the capacitor voltage is held constant during this interval, no glitches can be produced at the output.

In accordance with one feature of the invention, the voltages at each node are generated with two current sources that produce the currents switched by the current switch. The current sources generate first and second multiples of a reference current. The first current source, which generates the first multiple of the reference current, is connected to the second reference node and to the current switch, and the second current source, which generates the second multiple of the reference current, is connected to the first reference node and also to the current switch. The configuration of the current switch is changed, as the circuit switches between tracking and holding to change the direction of the current flow through the reference nodes to effect the voltage changes at the nodes. In so doing, the current switch directs to itself a current equal to the sum of the first and second multiples from one of the nodes.

In accordance with still another feature of the invention, the incremental voltages at each node are produced by four diodes, which are pair-wise forward biased by the currents from the current sources. The first diode is connected between the first reference node and the capacitor and is oriented to be forward-biased by the second current source as the circuit tracks the analog voltage. The first diode clamps the first node to one forward-biased drop above the capacitor voltage and also allows a charging current for the capacitor to be produced through it. The second diode is connected between the second reference node and the capacitor and is also oriented to be forward-biased by the second current source as the circuit tracks the analog voltage. The second diode clamps the second node to one forward-biased diode drop below the capacitor voltage and also allows a discharge current from the capacitor to flow through it. The third diode is connected between the output of the circuit and the first reference node and is oriented to be forward-biased by the first current source as the circuit holds the analog voltage. The third diode clamps the first node to one forward-biased diode voltage drop below the capacitor voltage as the circuit tracks the analog voltage. The fourth diode is connected between the second reference node and the output and is oriented to be forward-biased by the first current source as the circuit holds the analog voltage. The fourth diode clamps the second node to one forward-biased drop above the capacitor voltage as the circuit holds the analog voltage. Both the third and fourth diodes prevent any charging or discharging of the capacitor.

In this manner, as the circuit tracks the analog voltage, the first and second diodes are forward-biased and the third and fourth diodes are reversed-biased. Thus, the first node is one diode drop above the capacitor voltage and the second node is one diode drop below the capacitor voltage. Furthermore, the capacitor is free to charge or discharge the first and second diodes, respectively. Conversely, as the circuit holds the analog voltage, the first and second diodes are reversed-biased and the third and fourth diodes are forward-biased. Thus, the first reference node is one diode drop below the capacitor voltage and the second node is one diode drop above the capacitor voltage. In this manner, voltage charges of equal and opposite magnitude are produced at each node during the transition between the tracking and the holding modes. As a result, no net change occurs in the voltage across the capacitor.

In accordance with still another feature of the invention, the current switching is performed by two emitter-coupled transistor pairs, each connected to a current source configured as a current sink and capable of sinking a current equal to the sum of the currents produced by the first and second current sources. One of the transistor pairs is switched on when the circuit is tracking the input analog voltage, while the other of the transistor pairs is switched on when the circuit is holding the input analog voltage. The change in voltages at the first and second reference nodes occurs as a result of current switching performed by the emitter-coupled transistor pairs, which alternately connects one of the current sinks to the nodes. Additionally, one of the current sinks is paralled with a current related to the input voltage to control the charging and discharging of the capacitor during the tracking interval.

Other objects, features, and advantages of the present invention will become apparent from a consideration of the following detailed description and from the accompanying drawings.

BRIEF DESCRIPTION OF THE DRAWINGS

FIG. 3 shows a simplified schematic of the circuit of FIG. 2 when the circuit is tracking an input analog voltage;

FIG. 4 shows a simplified schematic diagram of the circuit in FIG. 2 when the circuit is holding an input analog voltage;

FIG. 6 shows the transition in voltage made at each of the two reference nodes in the circuit shown in FIG. 2 as the circuit switches between the tracking and the holding of an input analog signal.

DETAILED DESCRIPTION

Figure 1:
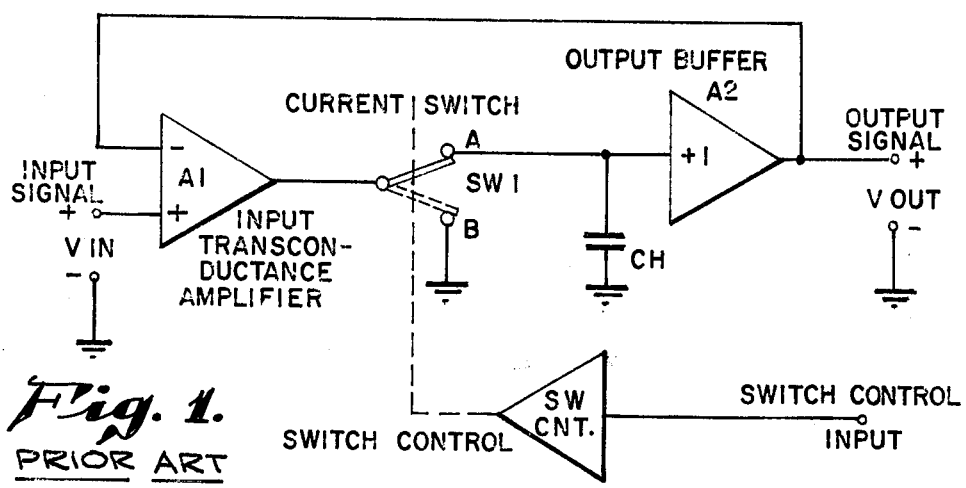
FIG. 1 shows a prior art version of an analog track and hold circuit.

Referring more particularly to the drawings, FIG. 1 shows prior art version of a modern analog track and hold circuit. In such a circuit, an input analog voltage is connected to a differential amplifier A1 configured as a transconductance amplifier. Transconductance amplifiers convert an input voltage to an output current. The output of transconductance amplifier A1 is thus the charging current for the holding capacitor CH. The charging current is connected to holding capacitor CH by means of a switch SW1. When the switch is in position A, the charging current is connected to the holding capacitor CH and the capacitor is free to charge or discharge to follow the input analog voltage. When the switch is in position B, circuit holds the analog voltage, and theoretically the capacitor CH is prohibited from charging or discharging. The switch SW1 is controlled by a switch control circuit connected to it. The switch control circuitry shown in FIG. 1 is conventional logic circuitry, and thus has been shown in block diagram form.

As described previously, the nature of the current switch SW1 is such that the unwanted charging or discharging of the capacitor CH occurs as the circuit changes between the tracking and the holding of the input analog signal. Such charging or discharging produces unwanted voltage glitches across the capacitor CH. These glitches are transferred to the output circuit by the unity-gain output voltage buffer A2.

The output buffer A2 is a high input impedance, low output impedance device which transfers the voltage across capacitor CH to the output without loading the capacitor. In addition to providing a low-impedance output, the voltage buffer A2 provides the voltage feedback signal for the input transconductance amplifier A1.

Figure 2:
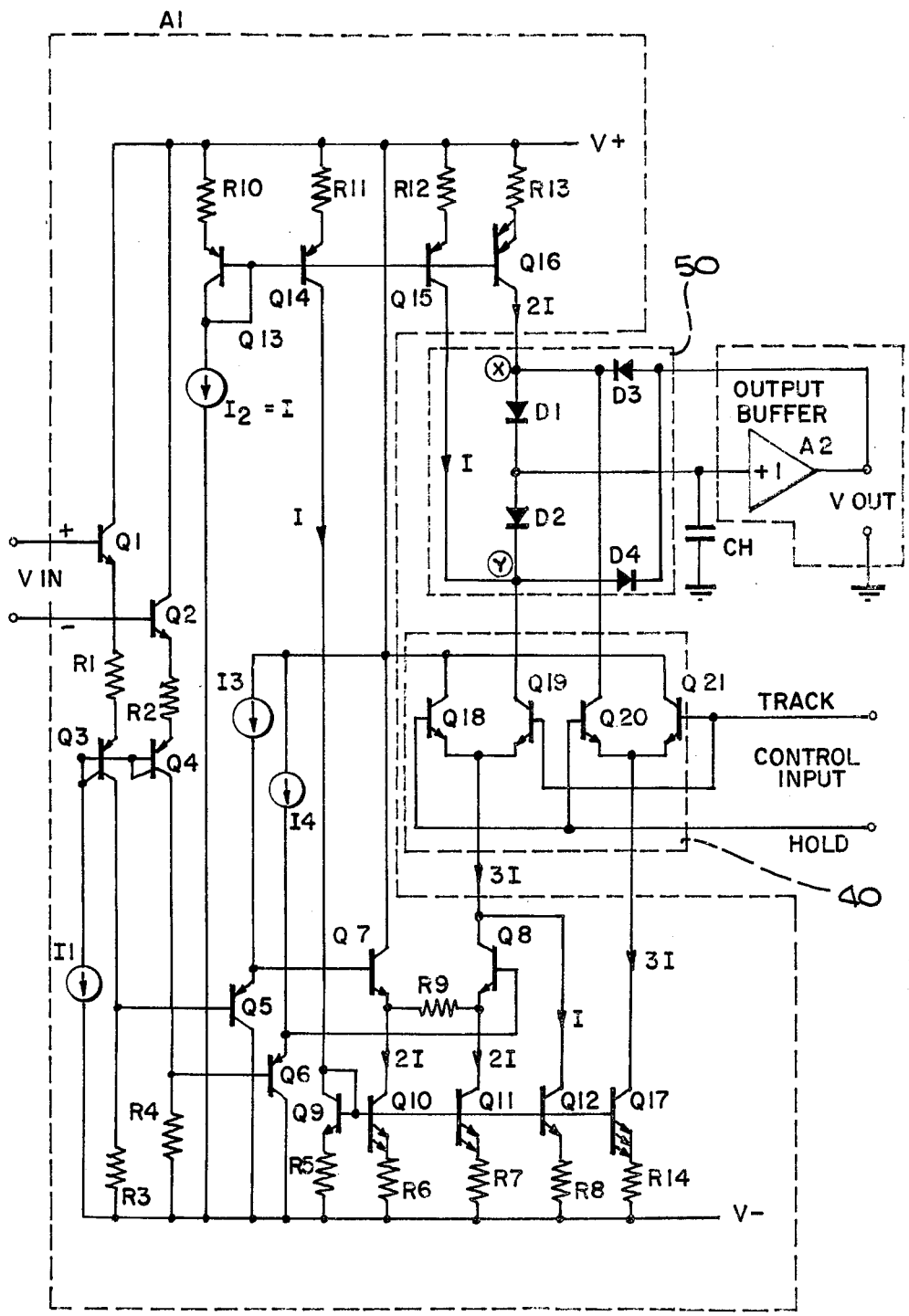
FIG. 2 shows a schematic diagram of an improved analog track and hold circuit according to the present invention, which provides a glitch-free voltage output.

FIG. 2 shows improved analog track and hold circuit according to the present invention. The improved circuit provides a low-glitch or glitch-free output voltage as the circuit changes between the tracking and the holding of an input analog signal. The basic blocks of this circuit are the input transconductance amplifier A1, the output buffer A2, the holding capacitor CH, the current switch, generally denoted 40, and a diode array, generally denoted 50. The transconductance amplifier A1, the output buffer A2, and the holding capacitor CH, may be regarded as conventional, although the transconductance amplifier has been modified to operate with the novel portions of the circuit, namely the current switch 40 and the diode array 50.

The basic concept of the circuit is to establish two reference nodes in the circuit, node X and node Y, and to provide a fixed voltage, relative to the capacitor voltage, at each node during the tracking and during the holding of an analog signal. The voltage is of an incremental value greater or lesser than the output voltage, which is also the voltage across the holding capacitor CH. The operation of the circuit may be understood by first considering FIG. 6, which shows the voltage transitions at nodes X and Y during the tracking and the holding of an input analog signal. FIG. 6 has time as its absicca, and voltage relative to the capacitor voltage VCH as its ordinate. The voltage at node X, Vx is shown as a solid line, and the voltage at node Y, Vy, is shown as a dashed line. Both Vx and Vy are referenced to VCH. As seen from FIG. 6, when the circuit is tracking an input analog voltage, node X is at a value of VCH+0.6 v and node Y is at a value of VCH−0.6 v. The sum of Vx and Vy is VCH, the capacitor voltage.

As the transition is made from the track mode to the hold mode, the voltage at node X starts to drop from a value of VCH+0.6 v to a value of VCH−0.6 v, while node Y makes the opposite transition. At all times the additive total of the voltages is VCH. When the transition to the hold mode is completed, node Y is at a value of VCH+0.6 v, and node X is at a value of VCH−0.6 v. The additive total of these voltages remains the same, the capacitor voltage VCH. Accordingly, the particular arrangement of the node voltages prevents the capacitor voltage from changing while the circuit between from the tracking mode and the holding mode. In this manner, a glitch-free or low-glitch output is produced.

Regarding the specific details of the circuit operation, the input transconductance amplifier A1 includes a matched differential input transistor pair Q1 and Q2. To these transistors Q1 and Q2 are connected another pair of transistors Q3 and Q4, whose purpose is to increase the breakdown voltage level of Q1 and Q2, to thereby allow the transistors to withstand a higher voltage level. Resistors R1 and R2 set the transconductance of transistors Q1 and Q2. Resistors R3 and R4 are load resistors for transistors Q3 and Q4. Transistors Q5 and Q6 are emitter-followers, and transistors Q7, Q8, Q9, Q10, Q11, Q12, and Q17 are biasing current sinks for emitter-coupled pairs Q18, Q19, and Q20, Q21. Transistors Q7 and Q8 are arranged as a differential pair, with resistor R9 setting their transconductance. The current sources I1, I2, I3, and I4 are current sources providing biasing currents for the various transistors connected to them. Transistors Q13 through Q16, and resistors R10 through R13, constitute a first base-coupled current mirroring array which generates two multiples of a reference current and which also supplies biasing current to a second base-coupled current-mirroring array formed by transistors Q9–Q12 and Q17.

The reference current flows through current source I2 and is designated as I. This current I also flows through the transistor-diode Q13 and generates the bias for transistors Q14, Q15 and Q16. The reference current I typically has a value of 50 microamps with a supply voltage V+ equal to +15 volts, and V− equal to −15 volts. The two current mirroring circuits are designed to source or sink specific multiples of this current. As is known, a current mirror is formed by a number of transistors sharing a common base region in an integrated circuit substrate. The magnitudes of the generated multiples of the reference current are dependent upon the ratios of the emitter regions of the transistors and the ratios of the emitter resistors.

In the current mirror comprising Q13, Q14, Q15, and Q16 the relative emitter regions and emitter registors of Q15 and Q13 are such that a current equal to I, the reference current, is generated through Q15. Similarly, the ratios of the emitter regions and emitter resistors Q16 and Q13 are such that a current equal to 2I is generated through Q16. Thus, the current mirror produces a first multiple (I) of the reference current I through Q15, and a second multiple (2I) of the reference current I through Q16. A current I through Q14 is generated in an identical fashion to the current through Q15. This current flows through the transistor-diode Q9 and generates the bias for transistors Q10, Q11, Q12, and Q17.

In the current mirror comprising Q9 through Q12 and Q17, the relative emitter regions and the emitter resistors of Q10 and Q9, as well as those of Q11 and Q9, are such that a current 2I is generated through Q10 and Q11. As a matter of convention, however, given the direction of the current flowing through Q10 and Q11, the current sources formed by Q10 and Q11 each sink a current of 2I. Similarly, the ratios of the emitter regions and emitter resistors of Q12 and Q9 are such that a current I is generated through Q12. Also, the ratios of the emitter regions and emitter resistors of Q17 and Q9 are such that Q17 sinks a third multiple (3I) of the reference current I.

The second current mirror array thus sinks the current generated by the first current mirror array and switched by the current switch 40 through the diode array 50. These current mirrors, while conventional, are modifications made to the transconductance amplifier A1 to set the currents flowing through the diode array 50 and the current switch 40. As will be described, a current equal to the sum of the first and second multiples, I and 2I, respectively, of the reference current I, which multiples are produced by the first current mirror array, is switched through the diode array 50 and into the current sink formed by the second current mirror array to effect the necessary voltage changes to provide the circuit with its novel features.

The novel properties of the circuit result from the particular configuration of the diode array 50 and the current switch 40. The diode array 50 comprises four diodes, D1, D2, D3, and D4. As is seen in FIG. 2, diode D1 is connected between the holding capacitor CH and the current generator Q16 producing the second multiple of reference current; diode D2 is connected between the holding capacitor CH and the current generator Q15 generating the first multiple the reference current;

diode D3 is connected between the output of the buffer A2 and Q16; and diode D4 is connected between the output of the buffer A2 and Q15. Diode D2 is also connected, via Q19, to the output of the transconductance amplifier when the current is in the track node.

The purpose of these four diodes is to establish a first reference node X at a certain incremental voltage potential different than the voltage across the voltage capacitor, and a second reference node Y at an incremental voltage potential equal in magnitude and opposite in sign to the voltage potential at node X. In this manner, and as explained in conjunction with FIG. 6, when the circuit is tracking the input analog voltage, node X is clamped to a fixed incremental voltage greater than the voltage across the capacitor CH, and node Y is clamped to the same incremental voltage below the voltage on capacitor CH. Conversely, as the circuit holds the input analog voltage, node X is clamped to a certain incremental voltage below the voltage on the holding capacitor and node Y is clamped to a certain voltage above the voltage on the holding capacitor. As the circuit switches between the hold and track modes, the nodes "exchange" their voltages in a symmetric fashion. At all times, the sum of of the voltage at node X and the voltage at node Y is always equal to the holding capacitor voltage. As a result, the holding capacitor is prohibited from charging or discharging while the transition is made between the hold mode and the track mode. Accordingly, the circuit has a glitch-free output.

Regarding the current switch 40, it is seen from FIG. 2 that transistors Q18, Q19, Q20, and Q21 in essence form a double-pole-double-throw current switch. There are two control inputs to the current switch array 40, a track input and a hold input. The control input levels for the bases of Q18–Q21 are typically switched 300 millivolts below a level of $-12.4$ volts. The bias of $-12.4$ volts is utilized to allow VCH to swing to $-11.5$ volts. Thus, in the track mode, the track input is at $-12.4$ v and the hold input is at $-12.7$ v. Similarly, in the hold mode, the hold input is at $-12.4$ v and the track input is at $-12.7$ v. When in the track mode, the voltage at the bases of Q19 and Q21 turn these transistors on, while the voltage at the hold input maintains transistors Q18 and Q20 off. Similarly, in the hold mode, the voltage at the bases of transistors Q18 and Q20 turn these transistors on, while the voltage at the track input maintains transistors Q19 and Q21 off. Also, since the switching done by Q18–Q21 is current switching, the transistors remain in their active regions and switch very quickly.

Transistor Q19 is connected to node Y, and transistor Q20 is connected to node X. Q19 and Q20 thus control the directions of the current flow in the diode array 50 to effect the voltage changes at node X and node Y. Q19 is also connected to the first current sink formed by transistors Q7, Q8, Q10, Q11, and Q12, and transistor Q20 is connected to the second current sink formed by transistor Q17. Therefore, the first current sink is connected to node Y in the tracking node and the second current sink is connected to node X in the holding mode. The current sink formed by Q7, Q8, Q10, Q11 and Q12 sinks a current 3I when the input VIN is zero. The current sink formed by transistor Q17 constantly sinks 3I. The 3I current passing into each sink is either supplied by its respective node when the current sink is connected to that node or by the V+ supply when the sink is disconnected from that node.

Simplified versions of the schematic shown in FIG. 2 depicting the operation of the circuit in the track mode and in the hold mode appear in FIGS. 3 and 4 respectively. In each of these Figures, Q15 and Q16 have been respectively replaced by current generators I and 2I; Q17 has been replaced by a current sink 3I; Q7, Q8, Q10, Q11, and Q12 have been replaced by a current sink 3I in parallel with a current source I'; and the remainder of A1 has been replaced with a reference current generator IREF, which generates reference current I.

Referring to FIG. 3, which depicts the operation of the circuit when it is in the track mode, it is seen that Q19 is on and Q20 is off. Accordingly, no current can flow through transistor Q20. As a result, the reference current 2I generated by transistor Q16 flows completely through diodes D1 and D2. In this manner, D1 and D2 are both forward-biased or "on". At node Y, the current 2I flowing through D2 combines with the current I from transistor Q15 and produces the sum 3I of these currents. This current 3I flows through transistor Q19 and through the current sink formed by Q7, Q8, Q10, Q11 and Q12.

As a result of the current flow during the track mode, which produces the forward-biasing of diodes D1 and D2, node X is clamped to a voltage value equal to the capacitor voltage plus 0.6 volts and node Y is clamped to a value equal to the capacitor voltage minus 0.6 volts. The voltages at nodes X and Y thus track VCH as it tracks VIN. As diodes D1 and D2 are forward-biased, diodes D3 and D4 are reversed-biased or "off". The voltage across diodes D3 and D4 must thus equal the voltage across D1 and D2. As seen from FIG. 3, diodes D3 and D4 are reversed-biased by the same degree to which diodes D1 and D2 are forward-biased, namely 0.6 volts.

While in the track mode, the capacitor CH is free to charge or discharge to follow the transitions of the input analog voltage, even though node X and node Y are always clamped to fixed incremental voltages relative to the capacitor voltage. This occurs as a result of a feedback loop from the output buffer A2 to the input of the transconductance amplifier. The feedback loop is necessary because the switching in the circuit is current switching and the input analog signal is stored as a voltage. More specifically, Q19 sinks a current 3I only when VIN is 0. When the (+) input at Q1 is greater than the (−) input at Q2, the output of Q19 is less than 3I. Thus, a current will flow into CH, causing VCH to rise. Conversely, if the (+) input at Q1 is less than the (−) input at Q2, Q19 will sink a current greater than 3I and VCH will decrease. For this reason, the current source I' has been shown in parallel with the lower left-hand current sink 3I. The I' current source either aids or opposes the current flowing into the 3I current sink to effect the current changes described above.

The control of the charging or discharging of CH is done by emitter-coupled transistor pair Q7–Q8. This differential amplifier senses, via Q7 and Q8, the voltage VIN. When the input voltage equals the output voltage (and thus the capacitor voltage), a current 2I flows through Q7 and Q8, as shown in FIG. 2. When the input voltage to Q1 is greater than the input voltage to Q2, the current through Q7 is greater than the current through Q8 and, accordingly, Q8 conducts less current. This causes a charging current to flow from D1 into capacitor CH until the voltages are equalized. If the input voltage to Q1 becomes less than the input voltage to Q2, the current imbalance through Q7 and Q8 causes Q8 to conduct more current, which causes a discharging current to flow from capacitor CH, through diode D2, until the voltages are again equalized.

The operation of the circuit in the hold mode is shown in FIG. 4. In the hold mode, the bases of transistors Q18 and Q20 are driven approximately 300 millivolts higher than the bases of Q19 and Q21. Accordingly, transistor Q19 is off and trasistor Q20 is on. As a result of transistor Q19 being off, no current flows through that transistor and, accordingly, no current flows through diodes D1 and D2. This results in the current 2I produced by transistor Q16 flowing into and out of node X without passing through diode D1. Similarly, the current I produced by transistor Q15 flows into and out of node Y without flowing through Q19. Rather, this current I flows first into diode D4 and then into diode D3. At the cathode of diode D3, this current I joins with the current 2I produced by transistor Q16 to form a current 3I. Transistor Q20 directs this current of 3I into its current sink formed by Q17. As an alternate method of analyzing the current flow through D3, the current through D4 can be viewed as flowing to the output of A2. At node X, the current 2I from transistor Q16 and the 3I current are summed with a current I supplied by the output of A2. Because the output of A2 is sinking a current of I from D4 and sourcing a current of I to D3, the net current supplied by the output of A2 is zero. In either case, capacitor CH is prohibited from charging or discharging when the circuit is in the hold mode because no current flows through D1 or D2. Transistor Q18 also shorts any AC current from the transconductance amplifier to the V+ supply.

As a result of these changes in the direction of the current, diodes D3 and D4 are forward-biased and diodes D1 and D2 are reversed-biased. Thus, node X is clamped to a value of VCH−0.6 v and node Y is clamped to a value of VHC+0.6 v. The voltage across diodes D1 and D2 must again equal the voltage across diodes D3 and D4 as diodes D1 and D2 are reversed-biased by the same degree that diodes D3 and D4 are forward-biased. Thus, the voltage at node X is approximately equal to the previous voltage at node Y and the voltage at node Y is equal to the previous voltage at node X. The sum of the voltages, however is still equal to the voltage across capacitor CH. Because of this symmetrical "exchange" of voltages, nodes X and Y remain completely clamped during the tracking and the holding of the input analog signal and also during the transition of the circuit between these two modes. Consequently, the voltage across the capacitor is prohibited from changing and a glitch-free output results.

The forward biasing of D3 and D4 in the hold mode can also be analyzed in terms of the action of A2 in reflecting VCH across D3 and D4 to clamp them in a forward-biased orientation, which then holds D1 and D2 reversed-biased. This action of A2 is initiated by the switching "on" of transistor Q20, which forward-biases D4 and stops the current flow through D1 and D2, thereby allowing the output of A2 to assume a value of VCH and beginning a bootstrapping process which maintains D4 (and D3) in a forward-biased orientation.

It is to be noted that, in FIG. 3 and FIG. 4, the forward-biased voltage drops of all the diodes has been shown to be equal. In practice, it is only necessary that the forward voltage drop of D1 equal the forward voltage drop of D2, and that the forward voltage drop of D3 equal the forward voltage drop of D4. Thus, in reality, during the tracking mode, node X is clamped to a value equal to the forward voltage drop of D1 and node Y is clamped to a value equal to the for voltage drop of D2, which is equal to the forward voltage drop of D1. Similarly in the hold mode, node X is clamped to a value equal to the forward voltage drop of D3 and node X is clamped to the forward voltage drop of D4, which is equal to the forward voltage drop of D3. Therefore, the actual swing of the voltage at node X is between the forward voltage drop of D1 and D3, and the swing of the voltage at node Y is between the forward voltage drop of D2 and the forward voltage drop of D4. In either case, nodes X and Y are always clamped to an equal and opposite incremental voltage value different than the capacitor voltage.

Accordingly, the novel features of the present invention occur as a result of the symmetric and opposing voltage swings at each node during the switching interval. While asymmetric swings at each node would also partially suppress the output glitches, the best results are obtained with a circuit producing the symmetric voltage swings.

Figure 5:
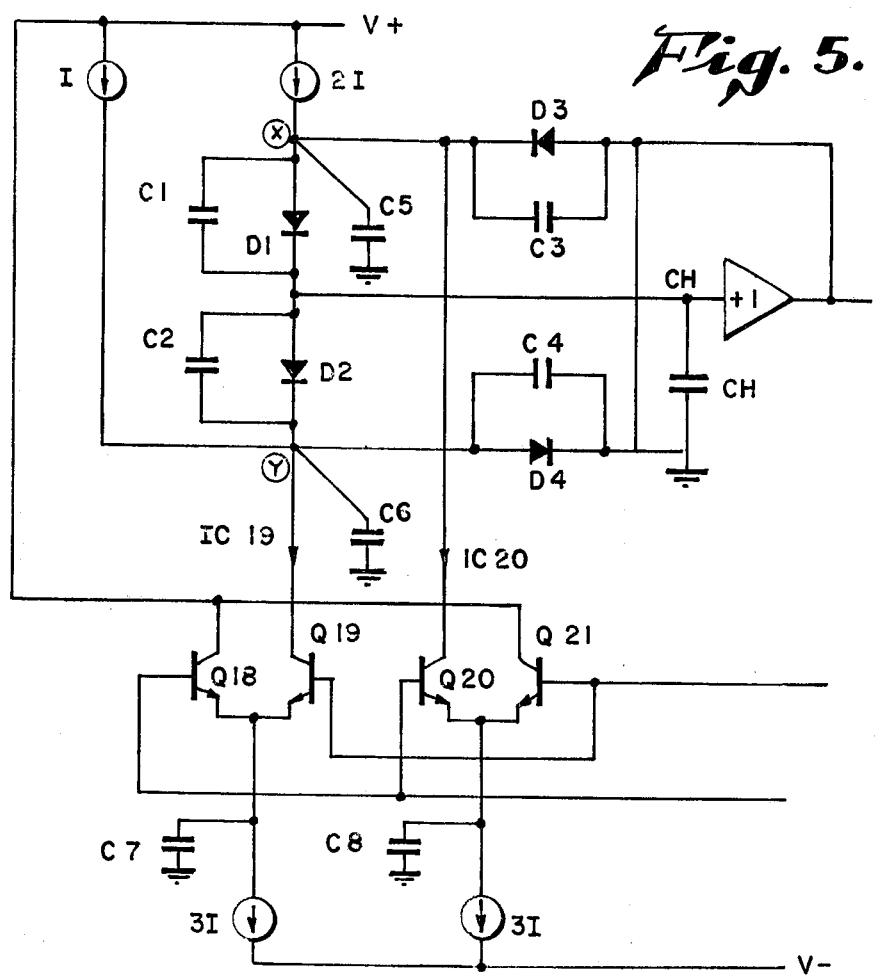
FIG. 5 shows the various parasitic capacitances in the circuit shown in FIG. 2.

The problem the present invention was created to solve occurred partially as a result of the nonideal operation of transistor switches. While the switching transistors Q18–Q21 used in the present invention are conventional, the arrangement of them and of diodes D1–D4 counterbalances their physical limitations. These limitations may be best discussed by considering the parasitic capacitances of the various circuit elements. FIG. 5 shows the parasitic capacitances, C1 through C8, associated with the various components in the diode array and the current switch. The parasitic capacitances are partially a result of the integrated circuit fabrication process and occur, among other places, in the junction formed between the p-type and n-type regions in the integrated circuit substrate. The key to realizing a completely glitch-less switching of the circuit between the hold mode and the track mode is in the matching of these parasitic capacitances. If the parasitic capacitances are matched, there will be matched charged coupling in D1 and D2, and in D3 and D4. Similarly, matching the parasitic capacitances will cause each diode D1 and D2 and D3 and D4 to reverse-bias in the same time interval. Thus, if the voltage across D1 equals the voltage across D2, and the voltage across D3 equals the voltage across D4, and C1 equals C2, and C3 equal C4, and C5 equals C6, the currents at node X will completely match the currents at node Y and the circuit will operate with a negligable glitch. This negligible glitch is possible because it is possible to achieve good matching of the parasitic capacitences when the circuit of the present invention is fabricated in integrated circuit form.

The low-glitch switching circuit just described can be used in a variety analog applications, such as oscillators, timers, memory circuits, as well as for a wide range of data-acquisition applications.

In the foregoing description of the present invention, a preferred embodiment of the invention has been disclosed. It is to be understood that other design variations are within the scope of the present invention. Thus, by way of example and not of limitation, different types of current sources and sinks besides current mirrors could be utilized to generate the necessary currents for each node; the capacitor CH could be replaced by several capacitors; means other than emitter-coupled transistor pairs could be used to switch the currents through the two nodes; the switching transistors could drive different types of current sinks; compound diodes could be used in the diode array; and means other than diodes could be utilized to perform the appropriate clamping of each of the reference nodes. Accordingly, the invention is not limited to the particular arrangement which has been illustrated and described in detail herein.

What is claimed is:

1. An improved analog signal storage circuit of the type having capacitor means for storing an analog voltage signal connected to the input of said circuit, input means for developing a charging current for said capacitor means from said analog voltage, and output means for buffering the voltage across said capacitor means to the output of said circuit, wherein said improvement prevents said voltage across said capacitor means from changing as said circuit switches between the tracking and the holding of said analog signal and comprises:
   (a) circuit means, connected to said capacitor means, for establishing first and second voltage reference nodes in said circuit, said establishing means including
      (i) means for holding said nodes at voltages incrementally different by a first value from said capacitor voltage as said circuit tracks said analog signal, said first incremental voltage value being of opposite polarity at each node, and
      (ii) means for holding said nodes at voltages incrementally different by a second value from said capacitor voltage as said circuit holds said analog signal, said second incremental voltage value being of opposite polarity from said first incremental voltage value, said incremental voltages being disposed so as to allow said charging current to flow through said capacitor as said circuit tracks said analog voltage and to prevent said flow as said circuit holds said analog voltage; and
   (b) current switch means, connected to both of said reference nodes, for directing currents through said circuit means, as said circuit changes between said tracking and said holding of said analog voltage signal, in a manner causing said voltage at said nodes to switch between said first and second incremental voltage values, said switching producing equal and opposite voltage magnitude changes at each of said nodes, thereby preventing any net change in said voltage across said capacitor means and preventing unwanted voltage changes at said output of said circuit.

2. An improved circuit as defined in claim 1, wherein said circuit further comprises:
   current source means for generating first and second multiples of a reference current, said first multiple being connected said second reference node and to said switching means, and said second multiple being connected to said first reference node and to said switching means, whereby said switching means alternately directs a current equal to the sum of said multiples through each of said nodes and into said switching means to effect said switching of said node voltages between said first and said second incremental values.

3. An improved circuit as defined in claim 2, wherein said circuit means for establishing comprises:
   (a) first diode means, connected between said first reference node and said capacitor means and disposed for forward-biasing by said second multiple of said reference current as said circuit tracks said analog voltage, for clamping said first node to at least one forward-biased diode voltage drop above said capacitor voltage as said circuit tracks said analog voltage, said diode voltage drop comprising said first incremental voltage value;
   (b) second diode means, connected between said second reference node and said capacitor means and disposed for forward-biasing by said second multiple of said reference current as said circuit tracks said analog voltage, for clamping said second node to at least one one forward-biased diode voltage drop below said capacitor voltage as said circuit tracks said analog voltage, said diode voltage drop across said second diode means being equal to said diode drop across said first diode means;
   (c) third diode means, connected between said output means and said first reference node and disposed for forward-biasing by said first multiple of said reference current as said circuit holds said analog voltage, for clamping said first node to at least one one forward-biased diode voltage drop below said capacitor voltage as said circuit tracks said analog voltage, said diode voltage drop of said third diode means comprising said second incremental voltage value; and
   (d) fourth diode means, connected between said second reference node and said output means and disposed for forward-biasing by said first multiple of said reference current as said circuit holds said analog voltage, for clamping said second node to at least one one forward-biased diode drop above said capacitor voltage as said circuit holds said analog voltage, said diode drop across said fourth diode means being equal to said diode drop across said third diode means, whereby,
      (i) as said circuit tracks said analog voltage said first diode means and said second diode means are forward-biased and said third diode means and said fourth diode means are reversed-biased, and said first reference node is clamped to one diode voltage drop above said capacitor voltage and said second node is clamped to one diode voltage drop below said capacitor voltage and said capacitor means can charge or discharge through said first and second diode means, respectively, and
      (ii) as said circuit holds said analog voltage, said first diode means and said second diode means are reversed-biased, and said third diode means and said fourth diode means are forward-biased, and said first node is clamped to one diode voltage drop below said capacitor voltage by said third diode means, and said second reference node is clamped to one diode voltage drop above said capacitor voltage by said fourth diode means, and said capacitor is prevented from charging or discharging, thereby providing a voltage change of equal magnitude at each of said nodes as said circuit changes between said tracking and said holding of said analog signal, and thereby preventing any net voltage change across said capacitor means during said changing of said circuit.

4. An improved circuit as defined in claim 1, wherein said first incremental voltage value is equivalent to said second incremental voltage value.

5. An improved circuit as defined in claim 4, wherein said incremental voltages are approximately 0.6 volts, whereby said first reference node switches between a value of VCH+0.6 v and VCH−0.6 v, with VCH being said voltage across said capacitor means, and said second reference node switches between VCH−0.6 v and VCH+0.6 v as said circuit switches between said tracking and said holding of said analog signal, said voltage change at each node thereby being equal and opposite, and preventing any voltage change across said capacitor means.

6. An improved analog signal storage circuit of the type having capacitor means for storing an analog voltage signal connected to the input of said circuit, input means for converting said analog voltage to a charging current for said capacitor means, and output means for buffering the voltage across said capacitor means to the output of said circuit, wherein said improvement prevents said voltage across said capacitor means from changing as said charging current is connected to or disconnected from said capacitor means, said improvement comprising:

circuit means, connected to said capacitor means, for establishing a first voltage reference node and a second voltage reference node in said circuit, each of said nodes being at equal and opposite incremental voltage values different from said capacitor voltage, said incremental voltages being disposed so as to allow said charging current to flow through said capacitor as said circuit tracks said analog voltage and to prevent said flow as said circuit holds said analog voltage; and current switch means connected to both of said reference nodes, for directing current in said circuit through said circuit means, as said circuit changes between said tracking and said holding of said analog voltage signal, in a manner causing said nodes to exchange said incremental voltage values, said exchange producing an equal and opposite voltage magnitude change at each of said nodes, thereby preventing any net change in said voltage across said capacitor means and at said circuit output.

7. An improved circuit as defined in claim 6, wherein said circuit further comprises:

current source means for generating first and second multiples of a reference current, said first multiple current being connected to said second reference node and to said switching means, and said second multiple current being connected to said first reference node and to said switching means, whereby said switching means alternately directs a current equal to the additive sum of said multiple through each of said reference nodes to effect said exchange of voltages between said nodes and said circuit changes between said tracking as said holding of said analog voltage signal.

8. An improved circuit as defined in claim 6, wherein said circuit means for establishing comprises:

(a) first diode means, connected between said first reference node and said capacitor means and disposed for forward-biasing by said second multiple of said reference current as said circuit tracks said analog voltage, for clamping said first node to at least one one forward-biased diode voltage drop above said capacitor voltage as said circuit tracks said analog voltage;

(b) second diode means, connected between said second reference node and said capacitor means and disposed for forward-biasing by said second multiple of said reference current as said circuit tracks said analog voltage, for clamping said second node to at least one one forward-biased diode voltage drop below said capacitor voltage as said current tracks said analog voltage;

(c) third diode means, connected between said output means and said first reference node and disposed for forward-biasing said first multiple of said reference current as said circuit holds said analog voltage, for clamping said first node to at least one one forward-biased diode voltage drop below said capacitor voltage as said circuit holds said analog voltage; and (d) fourth diode means, connected between said second reference node and said output means and disposed for forward-biasing by said first multiple of said reference current as said circuit holds said analog voltage, for clamping said second node to at least one one forward-biased diode voltage drop above said capacitor voltage as said circuit holds said analog voltage, whereby, (i) as said circuit tracks said analog voltage, said first diode means and said second diode means are forward-biased and said third diode means and said fourth diode means are reversed-biased, and said first reference node is clamped to one diode drop above said capacitor voltage and said second reference node is clamped to one diode drop below said capacitor voltage, said capacitor means being allowed to charge or discharge through said first diode means and said second diode means, respectively; and (ii) as said circuit holds said analog voltage, said first diode means and said second diode means are reverse-biased and said third diode means and said fourth diode means are forward-biased, and said first reference node is clamped to one diode drop below said capacitor voltage and said second reference node is clamped to one diode drop above said capacitor voltage, and said capacitor means is prevented from charging or discharging.

9. An improved circuit as claimed in claims 2 or 7, wherein said current source means comprises:

a plurality of transistors forming a first current mirror communicating with said reference current and generating currents having values of one and two times said reference current, thereby producing said first and second multiples.

10. An improved circuit as defined in claims 3 or 8, wherein said current switch means comprises:

first transistor switch means, connected to said second node and switched on when said circuit tracks said analog voltage, for sinking a current equal to the sum of said first and second multiples of said reference current from said second node, thereby maintaining said first diode means and said second diode means forward-biased and preventing current flow into said third diode means as said circuit tracks said analog voltage; and second transistor switch means, connected to said first reference node and switched on when said circuit holds said analog voltage, for sinking a current equal to the sum of said first and second multiples of said reference current from said first reference node, thereby maintaining said third diode means and said fourth diode means forward-biased and preventing current flow into said first diode means as said circuit holds said analog voltage, whereby said change in voltage at each of said nodes occurs as a result of said first and second transistor switch means alternately, and respectively, sinking current from said first and second reference nodes.

11. An improved circuit as defined in claim 10, wherein first and second transistor switch means each comprise:
an emitter-coupled transistor pair, with the collector of one of the said transistors being connected to the appropriate reference node; and
current sink means, connected to said coupled emitters, for sinking said sum of said first and second multiples of said reference current.

12. An improved circuit as defined in claim 11, wherein said current sink means connected to said emitter-coupled transistor pairs together comprise a plurality of transistors forming a second current mirror adapted to generate third multiples of said reference current; and
said second current mirror including current generator means, responsive to said input voltage and connected to said first switch means, for controlling the charging and discharging of said capacitor means, whereby:
(a) a current equal to the additive sum of said first and second multiples of said reference current flows through said first transistor switch means when said capacitor voltage is equal to said input analog voltage;
(b) a current less than said additive sum flows through said first transistor switch means when said capacitor voltage is greater than said input analog voltage, thereby allowing said capacitor means to charge; and
(c) a current greater than said additive sum flows through said first transistor switch means when said capacitor voltage is greater than said input analog voltage, thereby allowing said capacitor means to discharge.

13. An improved circuit as defined in claim 12, wherein said input means comprises:
transconductance amplifier means, communicating with said current generator means, for transforming said analog voltage input into a current useable by said current generator means to control said charging or discharging of said capacitor means.

14. An improved circuit as defined in claims 2 or 7, wherein said output means comprises:
unity-gain voltage buffer means, connected to said capacitor means, for providing said circuit with a low-impedance voltage output.

15. An improved circuit as defined in claim 14, wherein said capacitor means comprises:
at least one capacitor connected to the input of said buffer means.

16. An improved analog signal storage circuit of the type having capacitor means, including a connection terminal, for tracking an input analog signal, and switch means for changing the configuration of said circuit whereby said capacitor means holds, instead of tracks, said signal, wherein the improvement comprises:
first circuit means establishing first and second voltage nodes, with said terminal of said capacitor means connected in circuit between said nodes, said first circuit means latching said first and second nodes during a tracking mode to respective fixed voltage increments greater and lesser than the capacitor voltage; and
second circuit means, responsive to said switch means and cooperating with said first circuit means, for reversing the polarity of said voltage increments at said nodes relative to said capacitor voltage during the transition from said tracking to said holding mode, said reversed polarity voltages being latched at said nodes by said first circuit means, whereby said capacitor voltage is constantly maintained at a value between said voltages at said nodes, said polarity reversal during said switching transition serving to substantially eliminate changes in said capacitor voltage as said circuit switches between said tracking and said holding of said analog signal.

17. An improved circuit as defined in claim 16, wherein said first circuit means comprises:
(a) first diode means, connected between said first voltage node and said connection terminal and disposed for forward-biasing as said circuit tracks said analog voltage, for clamping said first node to at least one forward-biased diode voltage drop above said capacitor voltage as said circuit tracks said analog voltage, said diode voltage drop comprising said fixed voltage increment;
(b) second diode means, connected between said second reference node and said connection terminal and disposed for forward-biasing as said circuit tracks said analog voltage, for clamping said second node to at least one forward-biased diode voltage drop below said capacitor voltage as said circuit tracks said analog voltage, said diode voltage drop across said second diode means being equal in value to said voltage drop across said first diode means;
(c) third diode means, connected between the output of said circuit and said first node and disposed for forward-biasing as said circuit holds said analog voltage, for clamping said first node to at least one forward-biased diode voltage drop below said capacitor voltage as said circuit tracks said analog voltage; and
(d) fourth diode means, connected between said circuit output and said second node and disposed for forward-biasing as said circuit holds said analog voltage, for clamping said second node to at least one forward-biased diode voltage drop above said capacitor voltage as said circuit holds said analog voltage, whereby,
(i) as said circuit tracks said analog voltage, said first diode means and said second diode means are forward-biased and said third diode means and said fourth diode means are reverse-biased, and said first node is clamped to at least one diode voltage drop above said capacitor voltage and said second node is clamped to at least one diode voltage drop below said capacitor voltage and said capacitor means can charge and discharge through said first or second diode means, respectively, and
(ii) as said circuit holds said analog voltage, said first diode means and said second diode means are reverse-biased, and said third diode means and said fourth diode means are forward-biased, and said first node is clamped to one voltage drop below said capacitor voltage by said third diode means and said second reference node is clamped to one diode voltage drop above said capacitor voltage by said fourth diode means, and said capacitor is prevented from charging or discharging, thereby providing a voltage change of equal magnitude and opposite polarity at each of said nodes as said circuit switches between said tracking and said holding modes, said voltage changes thereby preventing any voltage change across said capacitor during said switching.

18. An improved analog storage circuit as defined in claim 17 wherein said second circuit means comprises:
means for generating a reference current;
first current source means, connected to said second reference node and to said switch means, for generating a first multiple of said reference current;
second current source means, connected to said first reference node and to said switch means, for generating a second multiple of said reference current, whereby said switching means alternately directs a current equal to the sum of said multiples through each of said voltage nodes to effect said polarity reversal at said nodes;
first and second current sink means, selectively connected by said switch means to one of said nodes, to sink said current equal to said sum of said first and second multiples as said circuit selectively tracks and holds said input signal; and
means, cooperating with one of said current sink means, for maintaining said capacitor voltage equal to said input signal voltage as said circuit tracks said input signal.

19. An improved circuit as defined in claim 18, wherein said switch means comprises:
first transistor switch means, connected to said second node and to said first current sink means and switched on when said current tracks said input signal, for directing a current equal to the sum of said first and second multiples of said reference current from said second node and into said first sink means, thereby maintaining said first diode means and said second diode means forward-biased and preventing current flow into said third diode means as said circuit tracks said analog voltage; and
second transistor switch means, connected to said first reference node and to said second current sink means, and switched on when said circuit holds said input signal, for directing a current equal to the sum of said first and second multiples of said reference current from said first reference node and into said second sink means, thereby maintaining said third diode means and said fourth diode means forward-biased and preventing current flow into said first diode means as said circuit holds said input signal, whereby said polarity reversal at each of said nodes occurs as a result of said first and second transistor switch means and corresponding first and second sink means alternately, and respectively, sinking said sum current from said second and first reference nodes.

20. An improved analog storage circuit as defined in claim 18, wherein said means for generating comprises a transconductance amplifier.

* * * * *